United States Patent
Hansen et al.

(10) Patent No.: US 9,824,909 B2
(45) Date of Patent: Nov. 21, 2017

(54) CHUCK, IN PARTICULAR FOR USE IN A MASK ALIGNER

(71) Applicant: SUSS MicroTec Lithography GmbH, Garching (DE)

(72) Inventors: Sven Hansen, Garching (DE); Thomas Huelsmann, Garching (DE); Katrin Schindler, Garching (DE)

(73) Assignee: SUSS MICROTEC LITHOGRAPHY GMBH (DE)

( * ) Notice: Subject to any disclaimer, the term of this patent is extended or adjusted under 35 U.S.C. 154(b) by 0 days.

(21) Appl. No.: 14/427,893

(22) PCT Filed: Dec. 4, 2013

(86) PCT No.: PCT/EP2013/075513
§ 371 (c)(1),
(2) Date: Mar. 12, 2015

(87) PCT Pub. No.: WO2014/106557
PCT Pub. Date: Jul. 10, 2014

(65) Prior Publication Data
US 2015/0294890 A1    Oct. 15, 2015

(30) Foreign Application Priority Data
Jan. 4, 2013   (EP) .................................... 13150260

(51) Int. Cl.
*H01L 21/68* (2006.01)
*G03F 9/00* (2006.01)
*H01L 21/683* (2006.01)

(52) U.S. Cl.
CPC ............ *H01L 21/682* (2013.01); *G03F 9/703* (2013.01); *H01L 21/6833* (2013.01)

(58) Field of Classification Search
CPC .................................................. H01L 21/682
(Continued)

(56) References Cited

U.S. PATENT DOCUMENTS 4,298,273 A * 11/1981 Nishizuka ........... G03F 7/70716
355/53
5,179,863 A * 1/1993 Uchida .................. B23Q 15/22
33/645
(Continued)

FOREIGN PATENT DOCUMENTS

CN          102576189 A      7/2012
EP          0 722 122 A1     7/1996
(Continued)

OTHER PUBLICATIONS

International Search Report dated Feb. 19, 2014 from PCT/EP2013/075513, 5 pages.
(Continued)

*Primary Examiner* — Christopher Fulton
(74) *Attorney, Agent, or Firm* — Hayes Soloway PC (57) ABSTRACT

A chuck for aligning a first planar substrate in parallel to a second planar substrate includes a top plate having a top surface for arrangement of the first planar substrate. A bottom plate is at least one distance measuring sensor configured to measure a distance between the top surface of the top plate and a surface of the second planar substrate, and at least three linear actuators in contact with the top plate and the bottom plate. The method for setting a gap between the first and second planar substrate includes measuring the thickness of the first planar substrate and measuring between a surface of the second planar substrate and the top surface of the top plate. The tilt adjusts between a top surface of the first planar substrate or the chuck and the surface of the second planar substrate by using at least three linear actuators of the chuck.

16 Claims, 5 Drawing Sheets (58) Field of Classification Search
USPC .................................................. 33/645, 568
See application file for complete search history.

(56) References Cited

U.S. PATENT DOCUMENTS

| | | | | |
|---|---|---|---|---|
| 5,443,932 | A * | 8/1995 | Ohta | G03F 9/7023 355/53 |
| 6,852,988 | B2 * | 2/2005 | Li | B82Y 10/00 250/491.1 |
| 6,876,438 | B2 * | 4/2005 | Tokita | G03F 9/7011 355/53 |
| 7,800,735 | B2 * | 9/2010 | Harb | H01L 21/68 355/72 |
| 8,454,771 | B2 * | 6/2013 | Horikoshi | H01L 21/67092 156/350 |
| 9,329,473 | B2 * | 5/2016 | Hansen | G03F 7/0002 |
| 2002/0063221 | A1 | 5/2002 | Li | |
| 2007/0190638 | A1 | 8/2007 | Hyde | |
| 2010/0204820 | A1 * | 8/2010 | Finarov | H01L 21/68728 700/213 |

FOREIGN PATENT DOCUMENTS

| | | |
|---|---|---|
| EP | 2006899 A2 | 12/2008 |
| JP | S 58-103136 A | 6/1983 |
| JP | S62254426 A | 11/1987 |
| JP | H03-038024 A | 2/1991 |
| JP | H11-194501 A | 7/1999 |
| JP | 2003124093 A | 4/2003 |
| JP | 2004-233398 A | 8/2004 |
| JP | 2008-310249 A | 12/2008 |
| KR | 20000021291 A | 4/2000 |
| WO | 2011098604 A2 | 8/2011 |
| WO | WO 2011/098604 A2 | 8/2011 |

OTHER PUBLICATIONS

Written Opinion dated Feb. 19, 2014 from PCT/EP2013/075513, 5 pages.

* cited by examiner

CHUCK, IN PARTICULAR FOR USE IN A MASK ALIGNER

BACKGROUND

1. Field of the Disclosure

The disclosure relates to a chuck, in particular for use in a mask aligner for aligning a wafer in parallel to a mask and a method for setting a gap between a wafer on a top plate of a wafer chuck and a mask.

2. Discussion of the Background Art

In the following, the information is frequently described with reference to the alignment of a wafer with respect to a mask. This reference to a wafer and a mask, however, should not be construed as a limitation, i.e. the claimed chuck and the method for setting a gap are equally applicable to the alignment of a first and second planar substrate in general.

For the production of microelectronic, micro-optical or micromechanical elements and devices, it is a common process to transfer a structure from a mask onto a substrate, e.g. a silicon wafer, using photolithography. The photolithography uses light to transfer said structures, e.g. geometric patterns, from the mask to a photo-sensitive chemical resist which is coated onto the substrate before. Chemical agents then etch the exposed structures in the substrate or enable deposition of other material in the transferred patterns onto the substrate. Industrial production may require the repetition of this process up to 50 times.

If the mask and the substrate are not in parallel, i.e. if there is a wedge between the mask and the wafer, the structures of the mask cannot be transferred uniformly onto the substrate resulting in defects and improper structures, in general in a reduced process window for the customer. In view of the numerous repetitions of the photolithography process, such a wedge error can lead to a high loss of production. Consequently, a proper alignment of the wafer and the mask with respect to each other is necessary. If the mask and the substrate are not repeatable positioned at the proper distance, structures will not be transferred accurately to the substrate.

As modern production processes use increasingly large substrates, the aforementioned alignment becomes increasingly challenging. The compensation of said wedge error is typically performed using a wedge error compensation (WEC) head.

Such a WEC head uses a passive mechanical system to align the wafer top surface with the mask bottom surface. The WEC head comprises a bottom part that is fixed and a top part that is movably supported and interconnected to the bottom part by means of springs. During the WEC process, the wafer and the mask are brought into mechanical contact (e.g. through high precision distance balls), subsequently the top is fixed against the bottom part in this position by means of brakes. As a result, the wafer and the mask are aligned in parallel.

However, for large substrates as well as sub-micron structures, such an alignment is not sufficiently precise. WO 2011/098604 A2 relates to a device for active WEC wherein the afore-mentioned known WEC head is complemented with piezoelectric actuators to allow for a more fine alignment on the basis of mechanical sensors or caliper; this method, however, allows a relative measurement during the WEC process only and requires a mechanical contact for each separate wafer. In addition, said method is less suitable for automatic machines due to relatively high abrasion.

US 2002/063221 A1 relates to a gap adjustment apparatus and gap adjustment method for adjusting gap between two objects.

EP 0 722 122 A1 relates to a process and device for adjusting the distance between a workpiece and a mask.

Further background art is listed as follows: JP 2004 233398 A, JP 11 194501 A, US 2007/190638 A1, EP 2 006 899 A2, JP 3 038024 A, JP 2008 310249 A, JP 58 103136 A.

It is an object of the disclosure to provide a device and a method to position two planar surfaces, in particular a wafer top surface and a mask, parallel to each other. In particular, it is an object of the present disclosure to provide a chuck, e.g. a wafer chuck, for use in combination with a WEC head or a chuck which even replaces a WEC head of a mask aligner for aligning a wafer in parallel to a mask. Furthermore, it is an object of the disclosure to provide a method for setting a gap between a wafer on a top plate of a wafer chuck and the mask.

SUMMARY

According to a basic idea of the disclosure, a chuck comprising a top plate and a bottom plate is provided for mounting a first substrate on the top surface of the top plate. The top plate of the chuck faces a second planar substrate. Between the top plate and the bottom plate of the chuck, linear actuators, e.g. three actuators, are arranged. The linear actuators can be fixedly attached to both plates or to only one of them. When the linear actuators are moved all by the same travel distance, the top plate of the chuck and the first planar substrate are moved towards or away from the second planar substrate thus changing the distance between the first and the second substrate without any change in a possible tilt between them. However, by moving the linear actuator by different travel distances, a possible tilt between the two substrates can be leveled out.

In order to determine said tilt, the variation of the distance between the surface of the first substrate and the surface of the second substrate has to be determined. Therefore, the distance between both surfaces facing each other has to be measured at at least three different positions. The distance between the at least three different positions has to be sufficiently large in order to accurately determine the full extent of tilting.

However, due to the limited space between the two substrates, it can be impractical to measure said distance directly. Hence, according to an aspect of the disclosure the distance between the top surface of top plate and the surface of the second substrate at at least three different positions may be measured instead. Together with the information on the variation of the thickness of the first substrate, the variation of the distance between the surface of the first substrate and the surface of the second substrate can be calculated. This necessary information of the variation of the thickness of the first substrate can be achieved by measuring the thickness of the first substrate at various positions of the substrate. Based on the calculated variation of the distance between the surface of the first substrate and the surface of the second substrate, the tilt between the first and the second planar substrate can be determined and subsequently leveled out by means of a suitable control of the linear actuators.

The linear actuators may be arranged at a circumferential edge region of the wafer chuck. For example, the linear actuators are arranged at the utmost position of the wafer chuck or at 70% to 100% of the radius of a circular wafer chuck. In such an arrangement, the distance between the linear actuators is relatively large so that, compared to an arrangement where the linear actuators are close together, a relatively large height of the stroke of a linear actuator results in small tilt compensation. As a consequence, the accuracy of the tilt compensation is comparatively high. Alternatively, the at least three actuators can be placed in the center region of the chuck resulting in a larger capability of tilt compensation and a lower compensation accuracy.

In addition, the linear actuators may be supported by spring bearings, e.g. three spring bearings, which are arranged between the top and the bottom plate. The spring bearings are fixedly attached to both, the top plate and the bottom plate, or fixedly attached to only one of them. For example, the spring bearings can be leaf springs and/or helical springs. The spring bearings may be dimensioned and arranged that they minimize possible vibrations, e.g. of the chuck, or of the system where the chuck is mounted, or the vibrations of the building in which the system is located. The spring bearings may preload the at least three linear actuators.

According to an embodiment of the disclosure, the at least three spring bearings are located adjacent to the at least three linear actuators and off-set in radial direction towards the center of the wafer chuck or radially outwardly.

For measuring the distance between the top surface of the top plate and the surface of the second substrate, distance measurement sensors, e.g. three or four sensors, can be arranged in the top plate of the chuck. For example, the distance measurement sensors can be arranged in the top plate of the chuck such that the reference surface of the distance measurement sensors is flush with the top surface of the top plate. Alternatively, the difference between the reference surface of the distance measurement sensors and the top surface of the top plate can be determined and this offset can be taken into account in the determination of the afore-mentioned tilt.

According to an embodiment of the disclosure, the variation of the distance between the top surface of the top plate and the surface of the second substrate can be measured with a measurement sensor being moveably arranged at the top plate, e.g. on a circular line. Thus, the at least three different positions are measured one after another.

In another embodiment, the distance measurement sensors can also be mounted on a holder ring which is attached to the outer side of the edge region of the wafer chuck. In particular, the distance measurement sensors can be mounted in the holder ring in a mariner that their reference surface is flush with the top surface of the top plate. The holder ring can also be fixed to the top plate. The holder ring can also comprise steering and supporting cables from and/or to the measuring sensor(s) and/or the linear actuators.

According to an embodiment of the disclosure, the chuck further comprises at least one thickness sensor, preferably a thickness sensor system. The thickness sensor system can be a pneumatic sensor system. The pneumatic sensor system can comprise a sensor lever with at least one pneumatic sensor head, e.g. two pneumatic sensor heads. In case of two or more sensor heads, the sensor heads are mounted at opposite sides of the sensor lever. Alternatively, only one sensor head is mounted on the lever, and at the opposite side of the senor lever a preload air bearing is mounted. Additionally, the pneumatic sensor system can further comprise pneumatic sensors being mounted in the top plate of the wafer chuck. With this pneumatic sensor system, the thickness of the first planar substrate can be measured. By measuring the thickness at a plurality of points, the pneumatic sensor system can also measure the thickness distribution, i.e. possible warping of the first planar substrate. Additionally, the sensor system can also measure the warping of the first planar substrate and the warping of the second planar substrate and the warping of the top plate.

However, it is understood that the thickness sensor and the thickness sensor system respectively are not restricted to pneumatic sensors. Also a capacitive sensor, an optical sensor, e.g. a laser sensor or an infrared sensor, an ultrasonic sensor or a magnetic inductive sensor are possible.

According to an embodiment, the bottom plate can be a single rigid plate or can comprise several rigid pieces. Also the top plate can be a single rigid plate or can comprise several rigid pieces. Preferably, the several rigid pieces of the top plate can be covered by a membrane.

A chuck according to the disclosure can be used as a wafer chuck for adjusting a mask and a wafer in a mask aligner. Such a wafer chuck can be put on top of a wedge error compensation head of a mask aligner or placed as a part of such a wedge error compensation head. The wafer chuck can also be installed in the mask aligner fully replacing an existing wedge error compensation head or making a wedge error compensation head redundant. A mask aligner in this context is a device for adjusting the mask to the wafer.

In case of the first substrate being a wafer and the second substrate being a mask, the surface of the mask which faces the wafer, is coated with chromium or any other suitable material, e.g. an electrically conducting material, that supports the application of capacitive distance measuring sensors. The chromium or the other suitable material can be structured with the patterns to be applied to the wafer or it may be applied specifically for the use in the distance measuring procedure. Advantageously the same material can be used for wafer patterning and the distance measurement.

The mask aligner can comprise means for performing photolithography which are for example a light source, e.g. an ultra violet light source and an appropriate lamp system. However, the chuck may also be used in other equipment that is typically used for wafer processing. In this sense, the current disclosure is also applicable to other means for processing the substrate such as mask coater, developer, bonder or a mask cleaner. Consequently, the mask aligner can also comprise other means for processing substrates such as development of the resist and/or cleaning of the photo mask as separate functions or e.g. in a so called litho-cluster.

It is understood that the afore-mentioned chuck cannot only be a wafer chuck for adjusting a mask and a wafer in a mask aligner. The basic idea of the present disclosure can also be applied to a variety of technical fields and areas where it is generally desired that two planar substrates are aligned in parallel to each other.

The disclosure also relates to a computer program product comprising one or more computer readable media having computer executable instructions for performing the steps of any one of the afore-described and/or the below-described methods for setting a gap and tilt between a wafer on a top plate of a wafer chuck and a mask.

BRIEF DESCRIPTION OF THE DRAWINGS

The disclosure is further disclosed with reference to the drawings.

Throughout the various figures, the same reference numbers are used for the same elements.

DETAILED DESCRIPTION OF THE PREFERRED EMBODIMENT

Figure 1A:
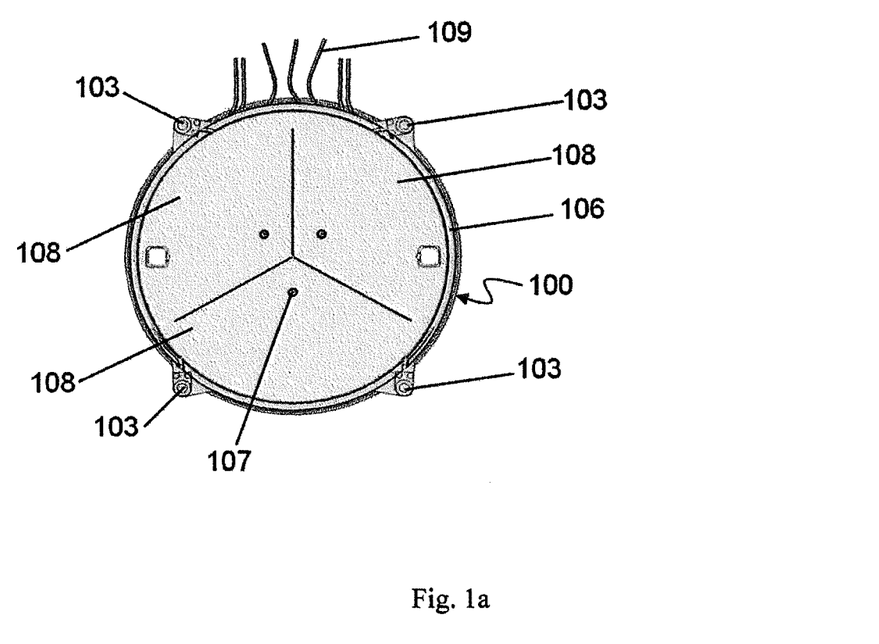
FIG. 1a schematically shows a top view of a wafer chuck according to an embodiment of the disclosure.

FIG. 1a schematically shows a top-view of a wafer chuck 100 according to an embodiment of the disclosure. A plurality of control and sensing cables 109 for the three linear actuators 104 and the four distance measuring sensors 103 are arranged in the holder ring 106. The wafer chuck 100 can be put on top or placed as a part of a wedge error compensation head of a mask aligner. The wafer chuck can also be installed in the mask aligner replacing an existing wedge error compensation head or making a wedge error compensation head redundant. The embodiment of the disclosure will be further explained in the following in view of FIG. 1b.

Figure 1B:
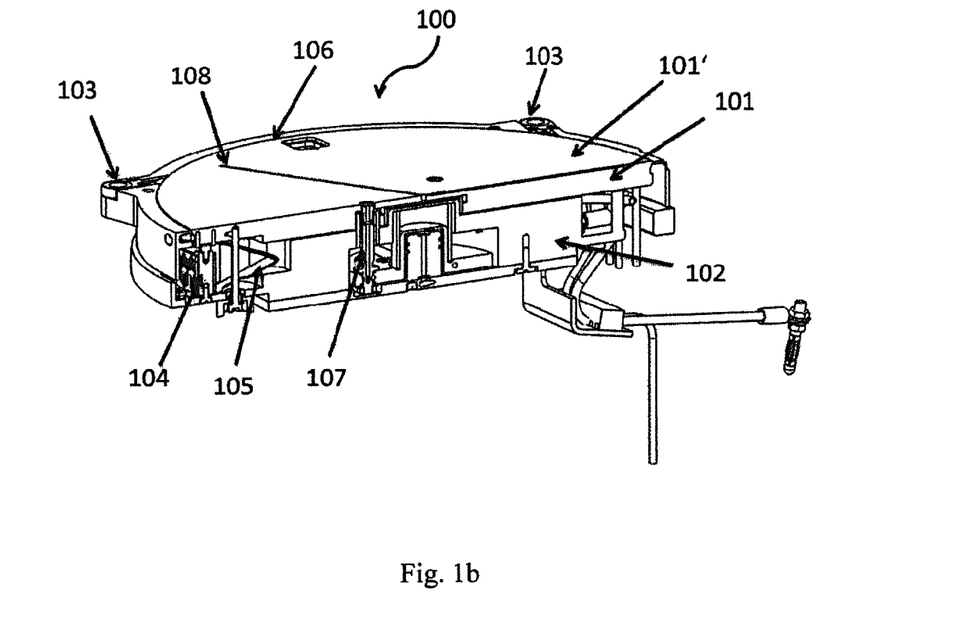
FIG. 1b schematically shows a perspective cross-section of a wafer chuck according to an embodiment of the disclosure.

FIG. 1b schematically shows a cross section of a wafer chuck 100. The wafer chuck 100 comprises a top plate 101 having a top surface 101'. The wafer 200 (see FIG. 3a-3c) to be arranged is put on the top surface 101'. The wafer 200 is fixed to the top surface 101', e.g. by vacuum applied via grooves 108 to which vacuum grooves (not shown) are connected. The wafer chuck 100 also comprises four distance measuring sensors 103 (two are shown), which may be capacitance sensors. The distance measurement sensors may be mounted in a holder ring 106 in a manner that their reference surface is flush with the top surface 101'. The holder ring 106 is fixed to the top plate 101.

The surface 301 of the mask 300 (see FIG. 3a-3c) faces the top surface 101' of the wafer chuck 100 when the mask 300 is mounted into the mask holder of the mask aligner. The surface 301 of the mask 300 is generally coated with chromium which is structured with the patterns to be applied to the wafer 200. Thus, the capacitance sensors 103 are capable to measure the distance between the top surface 101' of the wafer chuck 100 and the coated surface 301 of the mask 300. In addition, the wafer chuck 100 comprises a bottom plate 102 which is generally mounted on a wedge error compensation head.

The wafer chuck 100 also comprises three linear actuators 104 (one is shown), which are piezoelectric linear actuators in this embodiment. The three linear actuators 104 are in contact with the top plate 101 and the bottom plate 102, i.e. the three linear actuators 104 connect the top plate 101 with the bottom plate 102. In this embodiment, the holding fixtures for the linear actuators 104 are incorporated in the bottom plate 102 and thus, the bottom plate 102 comprises the linear actuators 104. However, it is understood that the holding fixture for the linear actuators 104 can also be incorporated in the top plate 101, i.e. the top plate 101 comprises the linear actuators 104. In the embodiment schematically shown in FIG. 1b, the three linear actuators 104 are located at a circumferential edge region of the wafer chuck 100. Thus, the distance between the linear actuators is relatively large so that a relatively large height of the stroke of a linear actuator results in small tilt compensation. Consequently, the accuracy is high compared to an arrangement where the linear actuators are close together at the center of the chuck 100. Nevertheless, the distance between the linear actuators 104 is large enough to ensure a sufficient accuracy of the tilt compensation.

If the three linear actuators 104 have the same travel distance, the top plate 101 is moved in a direction perpendicular to the bottom plate 102 and with respect to the bottom plate 102 without changing a tilt, if any, between the bottom plate 102 and the top plate 101. If at least one of the three linear actuators 104 has a travel distance different from the travel distances of the other two actuators, a tilt between the top plate 101 and the bottom plate 102 can be adjusted. In this context, the travel distance of at least one of the three linear actuators 104 can be zero.

Next to each linear actuator 104, a corresponding spring bearing 105 is in contact with the top plate 101 and the bottom plate 102, i.e. the three spring bearings 105 also connect the top plate 101 with the bottom plate 102. In this embodiment, the spring bearings 105 are fixedly attached to the bottom plate 102 and the top plate 101 by screws. The corresponding spring bearings 105 are off-set in radial direction towards the center of the wafer chuck 100 with respect to the linear actuators 104. The spring bearings 105 do not only serve as bearings for the top plate 101, but also provide a preload for the adjacent linear actuators 104, so that the top plate 101 is forced towards the bottom plate 102.

Three load pins 107 are located near the center of the wafer chuck 100. The load pins 107 for lifting the substrate or wafer support the wafer transfer to other parts of the mask aligner, e.g. by means of robot handling.

Figure 2A:
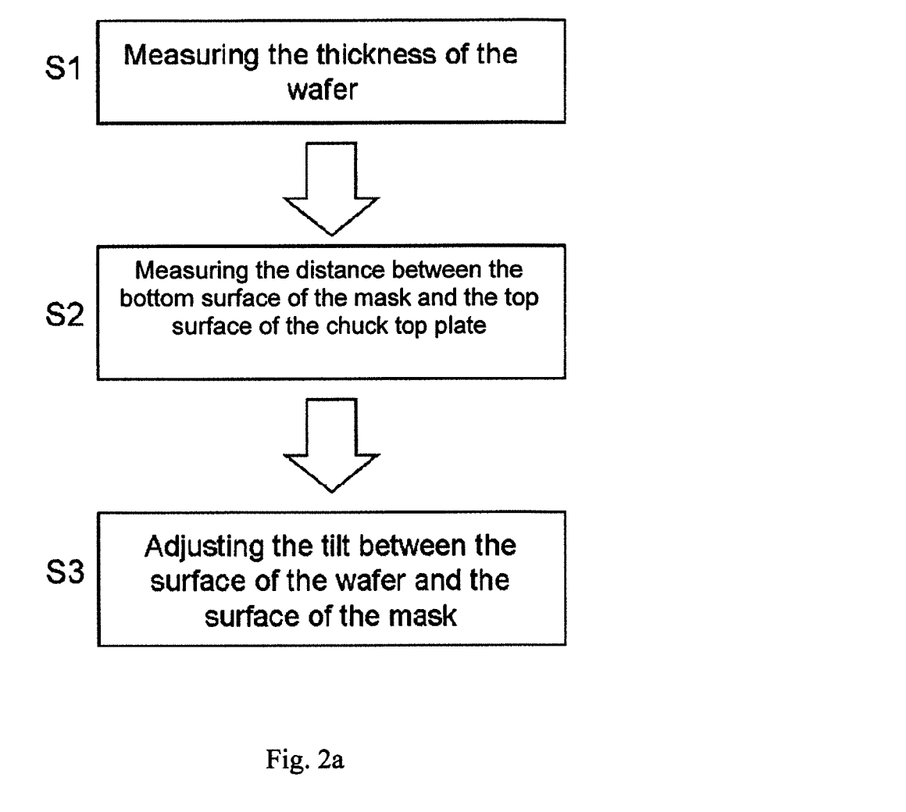
FIG. 2a schematically shows a flow chart representing method steps for setting a gap between a wafer and a mask according to an embodiment of the disclosure.

FIG. 2a schematically shows a flow chart representing method steps for setting the gap between the wafer 200 and the mask 300 according to an embodiment of the disclosure.

In a first step S1, the thickness of the wafer 200 is measured at at least one, preferably three different points of the wafer 200. Measuring the thickness of the wafer 200 at three different points allows considering inhomogeneities of the thickness of the wafer 200 or the substrate, e.g. a wafer wedge. If a wafer 200 has a high homogeneity of the thickness or variations of the thickness can be neglected in favor of a higher processing speed, the thickness of the wafer 200 can be measured at only one point. For a more detailed analysis and/or more accurate positioning, the thickness measurement at several points of the wafer 200 is useful. However, this first step S1 can be optionally performed in a separate station of the mask aligner, e.g. on the pre-aligner, before placing the wafer 200 onto the top surface 101' of the wafer chuck 100.

In a second step S2, the distance between the surface 301 of the mask 300 and the top surface 101' of the top plate 101 is measured by the distance measuring sensors 103 of the wafer chuck 100.

In a third step S3, the tilt between the surface 201 of the wafer 200 and the surface 301 of the mask 300 is adjusted by using the linear actuators 104 of the wafer chuck 100, preferably in combination with at least three spring bearings 105 of the wafer chuck 100. The spring bearings 105 preload the linear actuators 104. The tilt is calculated using the information achieved in steps S1 and S2 and, if necessary, a preceding calibration. The tilt is adjusted until it completely vanishes or is at least negligibly small, i.e. the surface of the wafer 200 and the surface of the mask are aligned in parallel to each other and the gap is adjusted.

Alternatively the tilt can be adjusted to a non-zero value e.g. predetermined by the user.

Before the first step S1, during the setup of the mask aligner, the distance measuring sensors 103 may be calibrated such that a possible height difference between the top surface of the measuring sensors 103 and the top surface 101' is leveled out or measured precisely. The resulting calibration values are then used in the further measurement procedure. This calibration allows for embodiments where the reference surface of the distance measuring sensors 103 cannot be flush with the top surface 101', e.g. due to constructional reasons.

Figure 2B:
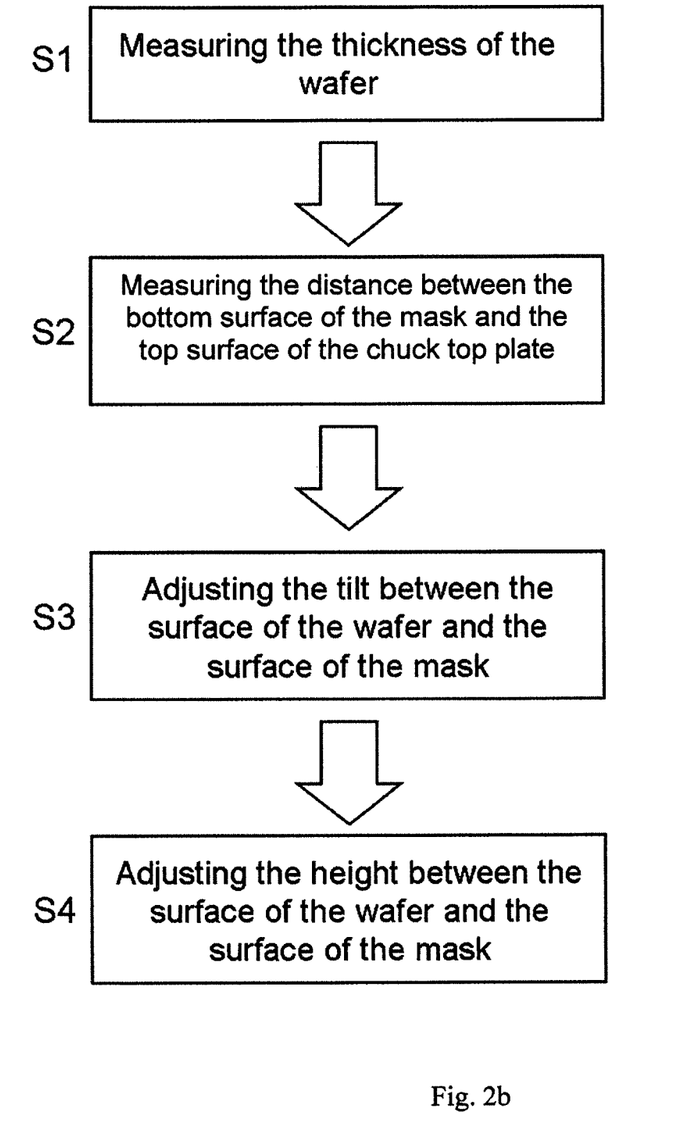
FIG. 2b schematically shows a flow chart representing method steps for setting a gap between a wafer and a mask with additional height adjustment according to an embodiment of the disclosure.

FIG. 2b schematically shows a flow chart representing method steps for setting the gap between the wafer 200 and the mask 300 according to another embodiment of the disclosure.

The steps S1 to S3 as well as the possible preceding calibration are the same as in the embodiment shown in FIG. 2a. However a fourth step S4 is added. In step S4, the distance between the wafer surface 201 and the mask surface 301 is adjusted to a predetermined value by using the linear actuators 104 of the wafer chuck 100, preferably in combination with the spring bearings 105 of the wafer chuck 100 The predetermined value may be entered by a user into a controller unit prior the first step S1. The maximum value for the distance adjustment using the linear actuators 104 is limited by their maximum travel distance. In addition, the distance may also be coarse-adjusted by moving the whole chuck 100 and the fine-adjustment is performed by using the linear actuators 104.

The steps S1 to S3 as well as the steps S1 to S4 can be repeated several times until the desired predetermined values for the tilt and the height are reached. Alternatively, the steps can be repeated two or three times, irrespective if the desired values are reached. Steps S3 and S4 may also be performed in opposite order or even at the same time.

Figure 3A:
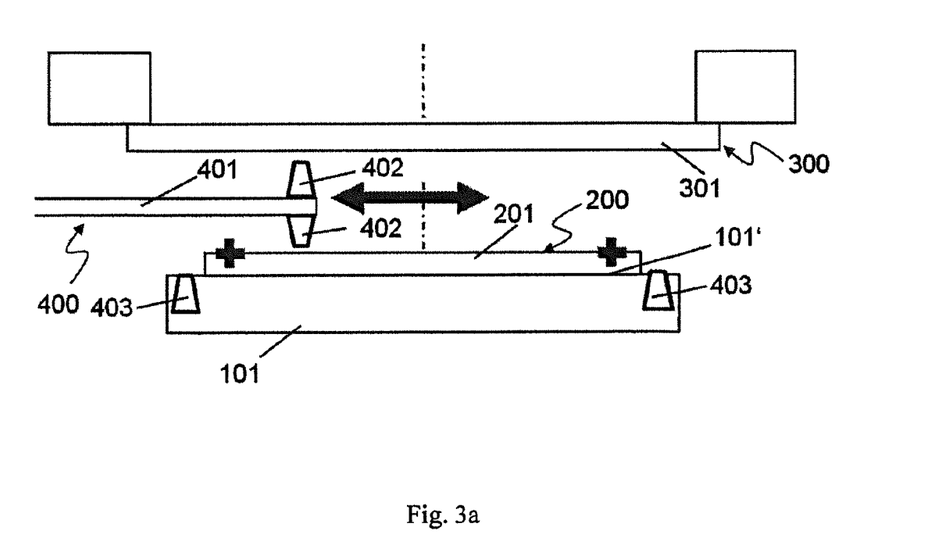
FIG. 3a schematically shows a front view of a pneumatic thickness sensor system according to an embodiment of the disclosure.

FIG. 3a shows another embodiment of the disclosure disclosing a pneumatic sensor system 400. The pneumatic sensor system 400 comprises a sensor lever 401 with two pneumatic sensor heads 402 mounted on opposite sides of the sensor lever 401. Additionally, the pneumatic sensor system 400 further comprises pneumatic sensors 403 being integrally mounted in the top plate 101 of the wafer chuck 100. The two pneumatic sensor heads 402 measure the distance between the top surface 201 of the wafer 200 and the surface 301 of the mask 300 facing the top surface 201 of the wafer 200 along the whole wafer 200 at a plurality of points by moving the sensor lever 401 across the wafer as schematically indicated with the arrows in said FIG. 3a. The pneumatic sensors 403 are measuring the distance between the top surface 101' of the top plate 101 of the chuck 100 and the surface 301 of the mask 300.

According to another embodiment, the measurement of the distance between the top surface 101' of the top plate 101 and the surface 301 may also be performed by the sensor heads 402 as well, so that the pneumatic sensors 403 may be completely omitted.

Both afore-mentioned distance measurements can be repeated several times, wherein a three-times-repetition is preferred. Based on both distance measurements—the distance between the top surface 201 and the surface 301 and the distance between the top surface 101' of the top plate 100 and the surface 301—the thickness of the wafer 200 can be calculated for the use in the afore-mentioned step S1. By measuring the distances at a plurality of points, the thickness distribution of the wafer 200 can be calculated, revealing possible variations in thickness over the entire wafer 200.

Additionally, the pneumatic sensor system 400 can, therefore, measure possible warping of the wafer 200 and the wafer surface 201, the mask 300 and the mask surface 301 or the top surface 101'. Consequently, these parameters can also be taken into consideration when calculating the tilt between the surface of the wafer 200 and the surface of the mask.

Figure 3B:
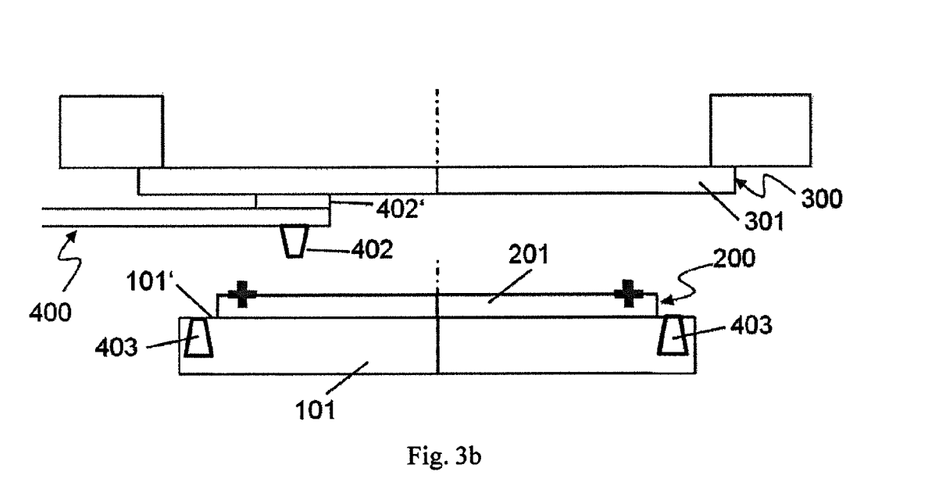
FIG. 3b schematically shows a front view of a pneumatic thickness sensor system according to another embodiment of the disclosure.

FIG. 3b shows another embodiment of the present disclosure wherein the pneumatic sensor system 400 comprises—instead of two sensor heads 402 opposite to each other (FIG. 3a)—a preload air bearing 402' mounted at the side of the lever 401 facing the mask 300. However, the functionality of the pneumatic sensor system 400 in FIG. 3b is the same as in FIG. 3a.

Figure 3C:
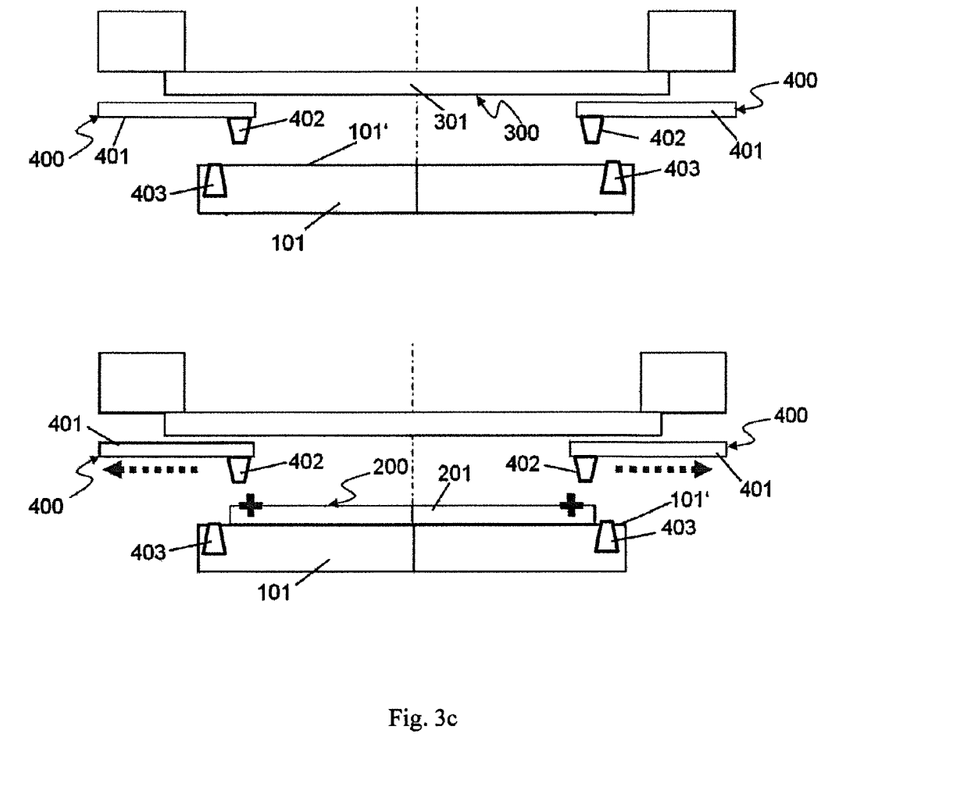
FIG. 3c schematically shows two front views of a pneumatic thickness sensor system according to further embodiment of the disclosure.

FIG. 3c shows a further embodiment of the pneumatic sensor system 400, which comprises only one sensor head 402 mounted at the side of the lever 401 facing the wafer. Accordingly, the sensor head 402 measures the distance between the sensor head 402 and the surface 201 of the wafer 200 and—after movement of the lever 401 in the direction of the dotted arrows in FIG. 3c—as well as the distance between the sensor head 402 and the top surface 101'. The pneumatic sensors 403 then measure the distance between the top surface 101' of the top plate 101 and the surface 301. Thus, the thickness of the wafer 200 as well as the possible warping of the wafer 200 and the wafer surface 201, the mask 300 and the mask surface 301 or of the top surface 101' can be measured and calculated.

In addition, the results of the distance measuring sensors 103 and thickness data as well as the value for the compensated tilt and the adjusted height, the number of the repetitions of the steps, the accuracy, the hysteresis and the travel distances of the linear actuators 104 can be logged and used for monitoring the performance specifically of the wafer chuck 100 and also the mask aligner in general. When the performance degrades in specific patterns from a predefined standard or new machine performance, maintenance can be scheduled. Additionally the type/pattern of degradation indicates specific issues, e.g. one or several of the linear actuators 104 or one or several of the distance measuring sensors 103 fail, or e.g. the tilt has to be corrected always in the same way which may indicate a problem with the head on which the wafer chuck 100 is mounted. This provides important information to a service technician about the type of service action or what kind of spare parts is needed prior to the scheduled service date. Thus, the downtime due to maintenance or due to unforeseen machine break-down can be reduced.

Moreover, the distance measuring sensors 103 and the linear actuators 104 can be operated in an online feedback loop, i.e. the tilt and the height are continuously adjusted at any time e.g. during the exposure. In very fast feedback loops even vibrations in the mask aligner can be compensated. This enables long exposure times with high gap-accuracy and tilt-accuracy as well as high stability and reproducibility requirements.

Because the distance measuring sensors 103 measure an absolute value for the distance between the surface of the mask and the top surface, no referencing procedure is necessary any more during wafer processing. Consequently, the mechanical wedge error compensation procedure and the necessary mechanical parts can be removed from the design and the process. In addition, a mechanical contact between machine parts (e.g. the high precision distance balls used for the classical wedge error compensation procedure) and the customer's wafer are therefore no longer needed.

According to this disclosure, the whole gap setting system is integrally built into the wafer chuck 101, which provides for the option to use the present chuck on an existing mask aligner with almost no changes to the mask aligner.

While the disclosure has been illustrated and described in detail in the drawings and foregoing description, such illustration and description are to be considered illustrative or exemplary and non-restrictive; the disclosure is thus not limited to the disclosed embodiments. Variations to the disclosed embodiments can be understood and effected by those skilled in the art and practicing the claimed disclosure, from a study of the drawings, the disclosure, and the appended claims. In the claims, the word "comprising" does not exclude other elements or steps, and the indefinite article "a" or "an" does not exclude a plurality and may mean "at least one".

What is claimed is:

1. A chuck for aligning a first planar substrate in parallel to a second planar substrate, said chuck comprising:
    (a) a top plate having a top surface for arrangement of the first planar substrate;
    (b) a bottom plate;
    (c) at least one distance measuring sensor configured to directly measure a distance between the top surface of the top plate and a surface of the second planar substrate, wherein the at least one sensor is mounted to the chuck; and
    (d) at least three linear actuators in contact with the top plate and the bottom plate.

2. The chuck of claim 1, wherein the at least three linear actuators are provided at a circumferential edge region of the wafer chuck.

3. The chuck of claim 1, wherein the at least three linear actuators are configured to move the top plate in a direction perpendicular to the top surface of the bottom plate of the wafer chuck and/or wherein the at least three linear actuators are configured to tilt the top plate with respect to the bottom plate.

4. The chuck of claim 1, further comprising at least three spring bearings connected to the top plate and the bottom plate.

5. The chuck of claim 4, wherein the at least three spring bearings are configured to preload the at least three linear actuators.

6. The chuck of claim 4, wherein the at least three spring bearings are located adjacent to the at least three linear actuators off-set in a radial direction towards the center of the wafer chuck or radially outwardly.

7. The chuck of claim 1, wherein the at least one distance measuring sensor is at least one selected from the group consisting of: a capacitive sensor, an optical sensor, an ultrasonic sensor, a magnetic inductive sensor, and a pneumatic sensor.

8. The chuck of claim 1, wherein the at least three linear actuators are piezoelectric linear actuators and/or ball screws and/or roller screws.

9. The chuck of claim 1, further comprising at least one load pin at the center of the chuck or close to said center.

10. The chuck of claim 1, further comprising at least one thickness sensor configured to measure at least one of the following: the thickness of the first planar substrate, the warping of the first planar substrate, the warping of the second planar substrate and/or the warping of the top plate, wherein the at least one sensor is selected from the group consisting of: a pneumatic sensor, a capacitive sensor, an optical sensor, an ultrasonic sensor and a magnetic inductive sensor.

11. A method for setting a gap between a first planar substrate, on a top plate of a chuck, and a second planar substrate, by means of a chuck for aligning a first planar substrate in parallel to a second planar substrate, said chuck comprising: (a) a top plate having a top surface) for arrangement of the first planar substrate; (b) a bottom plate; (c) at least one distance measuring sensor configured to measure a distance between the top surface of the top plate and a surface of the second planar substrate; and (d) at least three linear actuators in contact with the top plate and the bottom plate, the method comprising the steps of:
    (a) measuring the thickness of the first planar substrate at at least one point;
    (b) measuring the distance between a surface of the second planar substrate and the top surface of the top plate by at least one distance measuring sensor of the chuck;
    (c) adjusting the tilt between a top surface of the first planar substrate or the chuck and the surface of the second planar substrate by using at least three linear actuators of the chuck, preferably in combination with at least three spring bearings of the chuck; and
    (e) calculating a variation of the distance between the top surface of the first planar substrate and said surface of the second planar substrate before step (c), wherein the calculation of the variation is based on the thickness measurement of the first planar substrate, and
    wherein step (c) is carried out on the basis of the variation of the distance between the top surface of the first planar substrate and said surface of the second planar substrate.

12. The method of claim 11, further comprising a further step of:
    (d) adjusting the distance between the top surface of the first planar substrate and said surface of the second planar substrate to a predetermined value by means of the at least three linear actuators of the chuck, in particular as a means for one or more of the following:
    (d1) adjusting the gap without change of the tilt,
    (d2) adjusting the tilt without change of the gap,
    (d3) tilt adjustment prior to or after the gap adjustment, and
    (d4) concurrent tilt adjustment and gap adjustment,
    (d5) means (d1) to (d4) either with or without thickness measurement,
    (d6) tilt adjustment between the surface of the second substrate facing the first substrate and either the surface of the first substrate (200 facing the second substrate or the top surface of the top plate of the chuck, and
    (d7) means (d1) to (d6) with or without a predetermined value of the tilt.

13. The method of claim 11, wherein step (a) is performed by:
    (a1) measuring the first distance between the top surface of the first planar substrate and said surface of the second planar substrate in at least one point,
    (a2) measuring the second distance between the top surface of the top plate (101) and said surface of the second planar substrate in at least one point, and
    (a3) subtracting the first distance from the second distance.

14. The method of claim 11, further comprising the step of:
    (f) measuring of warping of at least one of the first planar substrate, the second planar substrate and the top surface, and wherein step (c) is carried out on the basis of the variation of warping of at least one of the first planar substrate, the second planar substrate and top surface.

15. The method of claim 11, further comprising a step of:
(g) adjusting the distance between the top surface of the first planar substrate and said surface of the second planar substrate to a predetermined value using a coarse adjustment means for moving the first substrate relative to the second substrate in the direction perpendicular to the surface of the first substrate.

16. A chuck for aligning a first planar substrate in parallel to a second planar substrate, said chuck comprising:
(a) a top plate having a top surface for arrangement of the first planar substrate;
(b) a bottom plate;
(c) at least one distance measuring sensor configured to directly measure a distance between the top surface of the top plate and a surface of the second planar substrate, wherein the second substrate is a mask; and
(d) at least three linear actuators in contact with the top plate and the bottom plate.

* * * * *